(12) United States Patent
Gao

(10) Patent No.: US 12,322,654 B2
(45) Date of Patent: Jun. 3, 2025

(54) SEMICONDUCTOR STRUCTURE, METHOD FOR FORMING SAME, AND WAFER ON WAFER BONDING METHOD

(71) Applicant: CHANGXIN MEMORY TECHNOLOGIES, INC., Hefei (CN)

(72) Inventor: Yuanhao Gao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 17/893,218

(22) Filed: Aug. 23, 2022

(65) Prior Publication Data

US 2023/0137875 A1    May 4, 2023

Related U.S. Application Data

(63) Continuation of application No. PCT/CN2021/137465, filed on Dec. 13, 2021.

(30) Foreign Application Priority Data

Oct. 29, 2021  (CN) .......................... 202111268970.6

(51) Int. Cl.
*H01L 21/00* (2006.01)
*H01L 21/768* (2006.01)
(Continued)

(52) U.S. Cl.
CPC .... *H01L 21/76898* (2013.01); *H01L 21/7684* (2013.01); *H01L 23/481* (2013.01);
(Continued)

(58) Field of Classification Search
CPC ........... H01L 21/76898; H01L 21/7684; H01L 23/481; H01L 24/03; H01L 24/05; H01L 24/80; H01L 2224/0347; H01L 2224/05624; H01L 2224/05684; H01L 2224/80895; H01L 2224/80896; H01L 25/0657; H01L 2225/06541; H01L 24/08; H01L 2224/08145; H01L 24/16; H01L 2225/06513; H01L 2224/73204; H01L 24/13; H01L 2224/16227; H01L 23/49816; H01L 2225/06517; H01L 2224/0401; H01L 2224/48227; H01L 24/81; H01L 25/0652;
(Continued)

(56) References Cited

U.S. PATENT DOCUMENTS 8,076,234 B1 * 12/2011 Park ................. H01L 21/76801
438/622
8,492,902 B2   7/2013 Lee
(Continued)

FOREIGN PATENT DOCUMENTS

CN    103000571 A    3/2013
CN    103474394 B    7/2015
(Continued)

*Primary Examiner* — Niki H Nguyen
(74) *Attorney, Agent, or Firm* — Syncoda LLC; Feng Ma

(57) ABSTRACT

A method for forming the semiconductor structure includes: a wafer in which a semiconductor device is formed is provided; a blind hole is formed in the wafer; a first metal material is deposited in the blind hole to form a through silicon via; and a first metal material deposited on a surface of the wafer is removed, and the surface of the wafer is planarized.

12 Claims, 20 Drawing Sheets

(51) Int. Cl.
   *H01L 23/00*   (2006.01)
   *H01L 23/48*   (2006.01)
(52) U.S. Cl.
   CPC .............. *H01L 24/03* (2013.01); *H01L 24/05* (2013.01); *H01L 24/80* (2013.01); *H01L 2224/0347* (2013.01); *H01L 2224/05624* (2013.01); *H01L 2224/05647* (2013.01); *H01L 2224/05684* (2013.01); *H01L 2224/80895* (2013.01); *H01L 2224/80896* (2013.01)
(58) Field of Classification Search
   CPC ....... H01L 2221/68327; H01L 23/5384; H01L 2224/16146; H01L 23/49827; H01L 2224/04105; H01L 2225/06548; H01L 2224/81; H01L 21/2007; H01L 2224/04042
   See application file for complete search history.

(56) References Cited

U.S. PATENT DOCUMENTS

| | | | |
|---|---|---|---|
| 8,847,399 | B2 | 9/2014 | Park |
| 10,354,980 | B1* | 7/2019 | Mushiga ............. H01L 23/5226 |
| 11,114,414 | B2 | 9/2021 | Li |
| 11,424,215 | B2* | 8/2022 | Hou .................. H01L 23/53228 |
| 2011/0318923 | A1 | 12/2011 | Park |
| 2012/0043666 | A1 | 2/2012 | Park |
| 2012/0074584 | A1 | 3/2012 | Lee |
| 2013/0210222 | A1* | 8/2013 | Lee ......................... H01L 24/03 438/612 |
| 2018/0366445 | A1* | 12/2018 | Dote ................. H01L 21/76898 |
| 2020/0006194 | A1* | 1/2020 | Huang ............... H01L 23/3675 |
| 2021/0028151 | A1 | 1/2021 | Li et al. |
| 2022/0122933 | A1* | 4/2022 | Hwang ................... H01L 25/18 |
| 2023/0077803 | A1* | 3/2023 | Choi .................. H01L 25/0657 257/774 |

FOREIGN PATENT DOCUMENTS

| | | |
|---|---|---|
| CN | 107833832 A | 3/2018 |
| CN | 109686657 A | 4/2019 |
| CN | 110379790 A | 10/2019 |

* cited by examiner

SEMICONDUCTOR STRUCTURE, METHOD FOR FORMING SAME, AND WAFER ON WAFER BONDING METHOD

CROSS-REFERENCE TO RELATED APPLICATIONS

The present application is a U.S. continuation application of International Application No. PCT/CN2021/137465, filed on Dec. 13, 2021, which claims priority to Chinese Patent Application No. 202111268970.6, filed on Oct. 29, 2021. International Application No. PCT/CN2021/137465 and Chinese Patent Application No. 202111268970.6 are incorporated herein by reference in their entireties.

BACKGROUND

In a Via Middle process, after a TSV (Through Silicon Via) structure of a wafer is manufactured, wafer on wafer bonding will be performed. In a wafer on wafer bonding process, an uneven surface of the wafer will lead to a bonding deviation, which affects electrical and thermodynamic properties and the like of bonded wafers, thereby affecting the reliability of the whole stacked chip.

SUMMARY

In view of this, the embodiments of the disclosure provide a semiconductor structure, a method for forming the same, and a wafer on wafer bonding method.

In a first aspect, the embodiments of the disclosure provide a method for forming a semiconductor structure, which includes the following operations.

A wafer in which a semiconductor device is formed is provided.

A blind hole is formed in the wafer.

A first metal material is deposited in the blind hole to form a TSV.

The first metal material deposited on a surface of the wafer is removed, and the surface of the wafer is planarized.

In a second aspect, the embodiments of the disclosure provide a wafer on wafer bonding method, which includes the following operations.

A first wafer and a second wafer are provided.

Wafer on wafer hybrid bonding is performed on the first wafer and the second wafer.

In a third aspect, the embodiments of the disclosure provide a semiconductor structure, which includes: a wafer, a TSV, and a bonding pad.

A semiconductor device is formed in the wafer.

The TSV is formed in the wafer.

The bonding pad is electrically connected to the TSV.

DETAILED DESCRIPTION

Figure 1A:
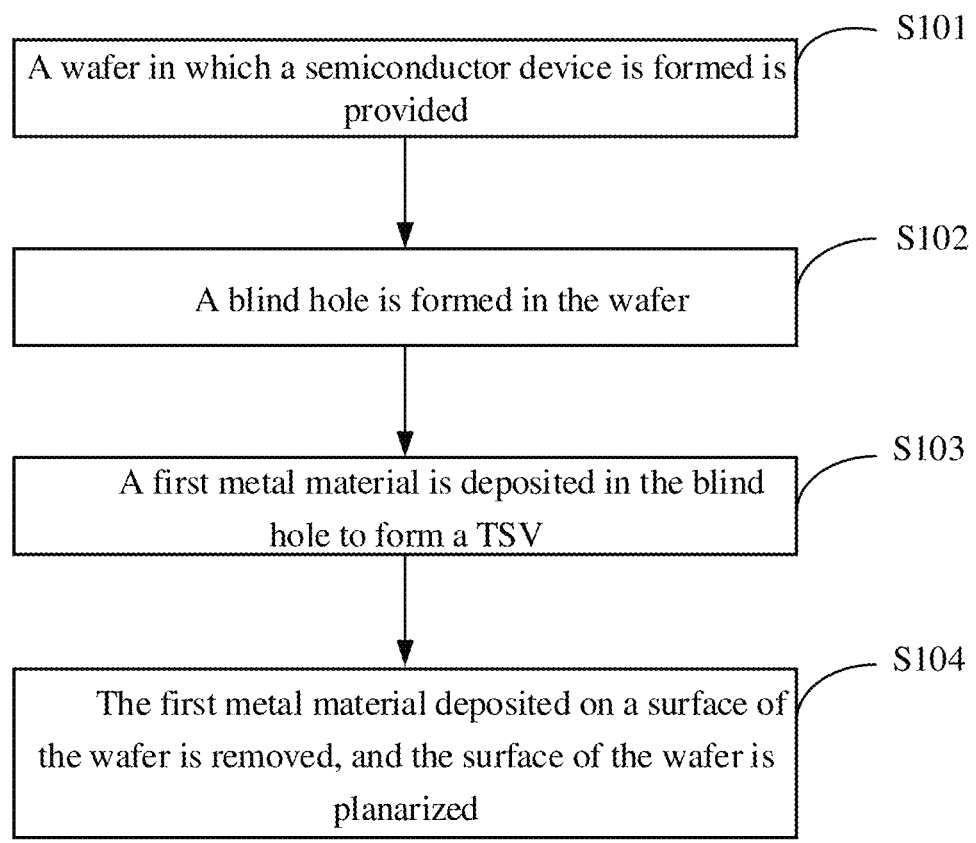
FIG. 1A illustrates an implementation flowchart of a method for forming a semiconductor structure provided by the embodiments of the disclosure.

The disclosure relates to the technical field of semiconductors, and relates, but is not limited, to a semiconductor structure, a method for forming the same, and a wafer on wafer bonding method.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers and devices and their relative dimensions may be exaggerated for clarity. Throughout, the same drawing signs represent the same elements.

It is to be understood that the terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, devices, and/or components may be determined, but the presence or addition of one or more other features, integers, steps, operations, devices, components, and/or groups is also possible. As used herein, terms "and/or" includes any and all combinations of the related listed items.

A High Bandwidth Memory (HBM) technology is to obtain more capacity and wider bandwidth of an Integrated Circuit (IC) of a system, and the development of this technology is inseparable from the application of a TSV technology. According to the difference between a Front End of Line (FEOL) and a Back End of Line (BEOL) of an integrated circuit corresponding to a TSV manufacturing sequence, the TSV technology is divided into Via First, Via Middle, and Via Last. The Via Middle technology is a technology for manufacturing a TSV after a transistor is manufactured. By the technology, the manufactured vias have small aperture and high density, which greatly increases the transmission bandwidth between chip layers, so the Via Middle technology has been widely applied.

In a Via Middle process, thinning and wafer on wafer bonding will be performed after a TSV structure of a wafer is manufactured. In a wafer on wafer bonding process, an uneven surface of the wafer will lead to a bonding deviation, which affects electrical and thermodynamic properties and the like of bonded wafers, thereby affecting the reliability of the whole stacked chip.

According to the semiconductor structure, the method for forming the same, and the wafer on wafer bonding method provided by the embodiments of the disclosure, a blind hole is formed in the wafer. Then, the first metal material is deposited in the blind hole to form the TSV. Next, the first metal material deposited on the surface of the wafer is removed, and the surface of the wafer is planarized. Finally, a bonding pad is formed on the planarized surface of the wafer. It can be seen that planarization is performed after the TSV is formed, and the bonding pad is formed on the planarized surface of the wafer; and the surface of the wafer is planar when the bonding pad is finally formed by performing planarization once after the TSV is formed, which not only simplifies a manufacturing process of the wafer, but also reduces the deviation caused by an uneven surface of the wafer in a wafer on wafer bonding process, so that the reliability of a stacked chip can be effectively improved.

Specific implementation modes of the disclosure are described below with reference to the accompanying drawings. When the embodiments of the disclosure are described in detail, for ease of description, the schematic diagrams will not be locally enlarged according to the general scale, and the schematic diagrams are only examples, which shall not limit the scope of protection of the disclosure.

FIG. 1A illustrates an implementation flowchart of a method for forming a semiconductor structure provided by the embodiments of the disclosure. As shown in FIG. 1A, the method includes the following operations.

At S101, a wafer in which a semiconductor device is formed is provided.

In some embodiments, the wafer refers to a wafer for manufacturing a semiconductor circuit, such as a silicon wafer. A preparation process of the silicon wafer includes: a silicon crystal seed is doped after high-purity polysilicon is dissolved; then, the polysilicon is pulled out slowly to form cylindrical monocrystalline silicon; and finally, a silicon crystal rod is ground, polished, and sliced to form the wafer. The main processing modes of the wafer include wafer processing and batch processing.

In some embodiments, a semiconductor device is an electronic device which has the conductivity between a good conductor and an insulator, completes specific functions by using the special electrical characteristics of a semiconductor material, and can be arranged to produce, control, receive, transform, and amplify a signal and perform energy conversion. For example, the semiconductor device may be a crystal diode, or a transistor (such as a bipolar transistors or a field effect transistor). The semiconductor device may be a multilayer metal structure composed of two or more independent metal layers.

At S102, a blind hole is formed in the wafer.

During implementing, at S102, a blind hole with a preset depth may be formed in a preset position of a surface of the wafer. The preset depth may be determined according to the factors, such as the thickness of the wafer and the thickness of a wafer to be bonded. Wafer thinning treatment will be performed in a subsequent process of the blind hole, so in some other embodiments, a via may also be formed in the wafer at S102.

In some embodiments, the preset position may be determined according to the factors, such as the number and the positions of the semiconductor device. For example, the preset position may be determined according to the number of the semiconductor device.

Figure 1B:
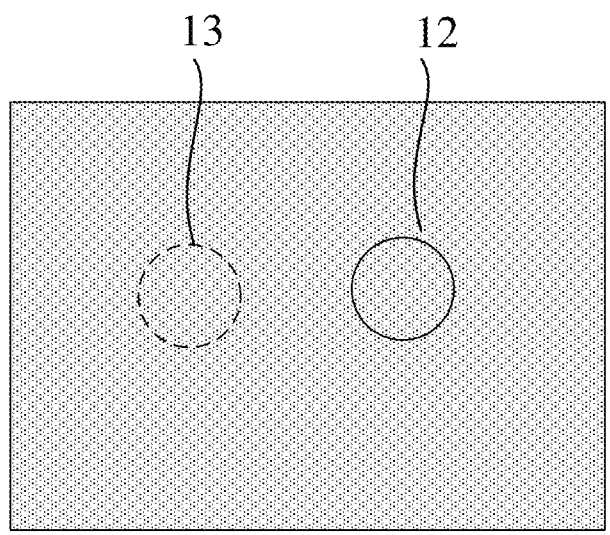
FIG. 1B illustrates a vertical view of positional relationships of a blind hole and a semiconductor device provided by the embodiments of the disclosure.

Case 1: when there is one semiconductor device, the blind hole is arranged on any side of the semiconductor device, such as a front side, a rear side, a left side, or a right side. As shown in FIG. 1B, a blind hole 13 is arranged on the left side of the semiconductor device 12.

Figure 1C:
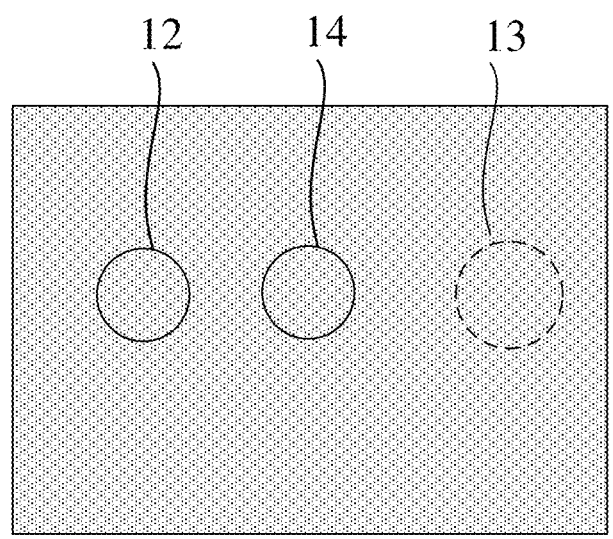
FIG. 1C illustrates a vertical view of positional relationships of a blind hole and a semiconductor device provided by the embodiments of the disclosure.

Case 2, when there are two or more semiconductor devices, the blind hole is arranged on the left side or the right side of the semiconductor devices. Referring to FIG. 1C, the blind hole 13 is located on the right side of the semiconductor device 12 and a semiconductor device 14.

Here, the blind hole may be formed by etching. For example, an etching process may adopt at least one of a dry etching process, a wet etching process, or an auxiliary electrochemical etching process to form the blind hole in the wafer.

At S103, a first metal material is deposited in the blind hole to form a TSV.

Here, the "deposition" process may adopt a Chemical Plating (CP) process in addition to a Chemical Vapor Deposition (CVD) process and a Physical Vapor Deposition (PVD) process. Thus, a first metal material can be filled on an upper surface of the wafer and an inner wall of the blind hole to form conductive layers.

A technology of forming a TSV (TSV technology) is a technical solution of stacking chips in a Three-Dimensional (3D) IC to realize interconnection. The TSV technology can maximize the density of chips stacked in a 3D direction, minimize interconnection lines between the chips, and minimize the overall dimension, so as to effectively realize 3D chip stacking and manufacture the chips with more complex structures, stronger performance, and higher cost efficiency.

Here, the first metal layer is used for filling the blind hole to form the conductive layer of the TSV. The conductive layer is used for realizing the electrical connection between two wafers after wafer on wafer bonding, so the first metal material may be any conductive material, such as tungsten (W), aluminum (Al), and copper (Cu). The deposition processes adopted for different conductive materials are also different. When W is used as the conductive material, a CVD method is adopted. When Al is used as the conductive material, the CVD method or a PVD method is adopted. When Cu is used as the conductive material, a CP method is adopted.

At S104, the first metal material deposited on a surface of the wafer is removed, and the surface of the wafer is planarized.

In actual applications, after the TSV is formed, excess first metal material will be deposited on the upper surface of the wafer, so that some bumps and grooves will be formed on the upper surface of the wafer. Therefore, the excess first metal material deposited on the surface of the wafer needs to be removed. The process for removing includes etching, grinding, polishing, etc.

In some embodiments, the planarization is a technology to planarize the surface of the wafer, which can improve the performance of a wafer or a chip. The operation that the surface of the wafer is planarized includes: the surface of the wafer is planarized through a chemical mechanical grinding process.

In the embodiments of the disclosure, after the TSV is formed, the planarization is formed through a chemical mechanical grinding process, and the surface of the wafer is planar when a bonding pad is formed subsequently by performing planarization once after the TSV is formed, which not only simplifies a manufacturing process of the wafer, but also reduces the deviation caused by an uneven surface of the wafer in a subsequent wafer on wafer bonding process, so that the reliability of a stacked chip can be effectively improved.

Next, S101 to S104 will be further described in detail with reference to FIG. 2A to FIG. 2D.

Figure 2A:
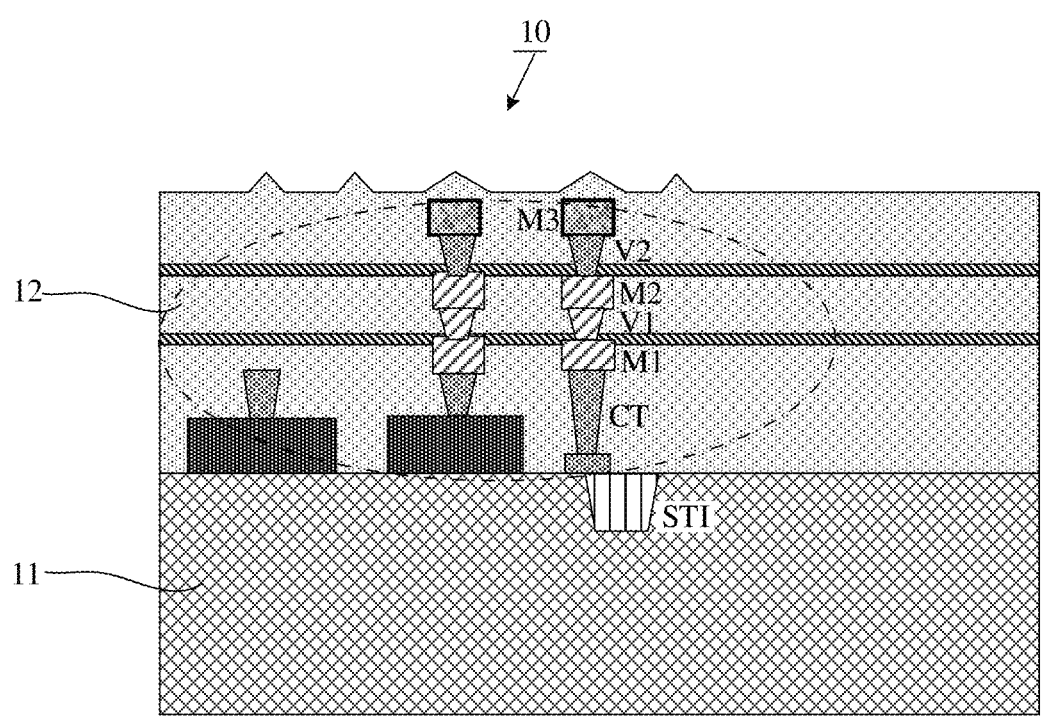
FIG. 2A illustrates a schematic diagram of forming processes of the semiconductor structure provided by the embodiments of the disclosure.
Figure 2B:
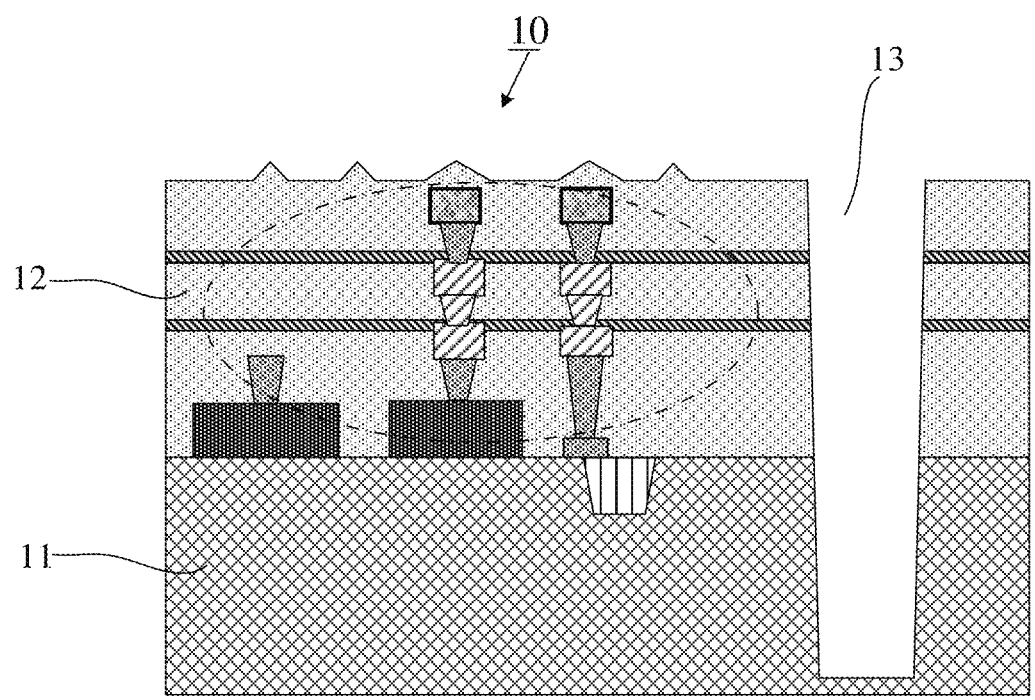
FIG. 2B illustrates a schematic diagram of forming processes of the semiconductor structure provided by the embodiments of the disclosure.
Figure 2C:
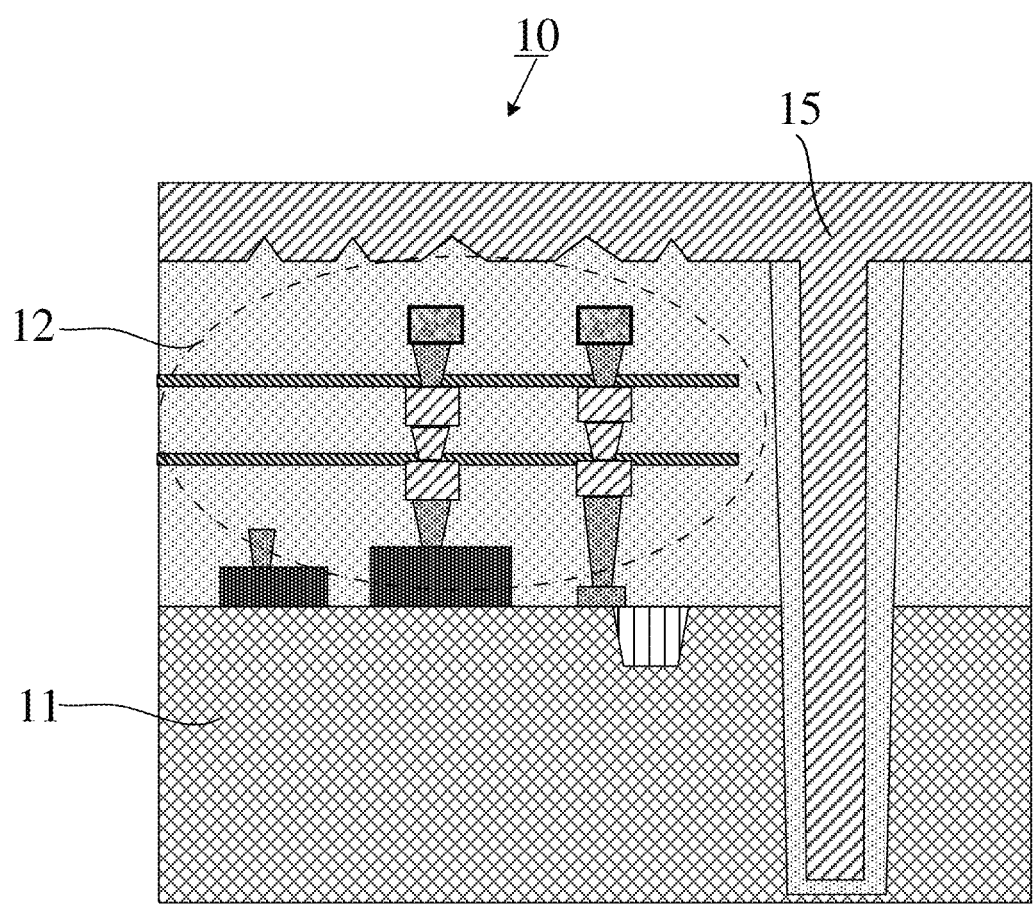
FIG. 2C illustrates a schematic diagram of forming processes of the semiconductor structure provided by the embodiments of the disclosure.
Figure 2D:
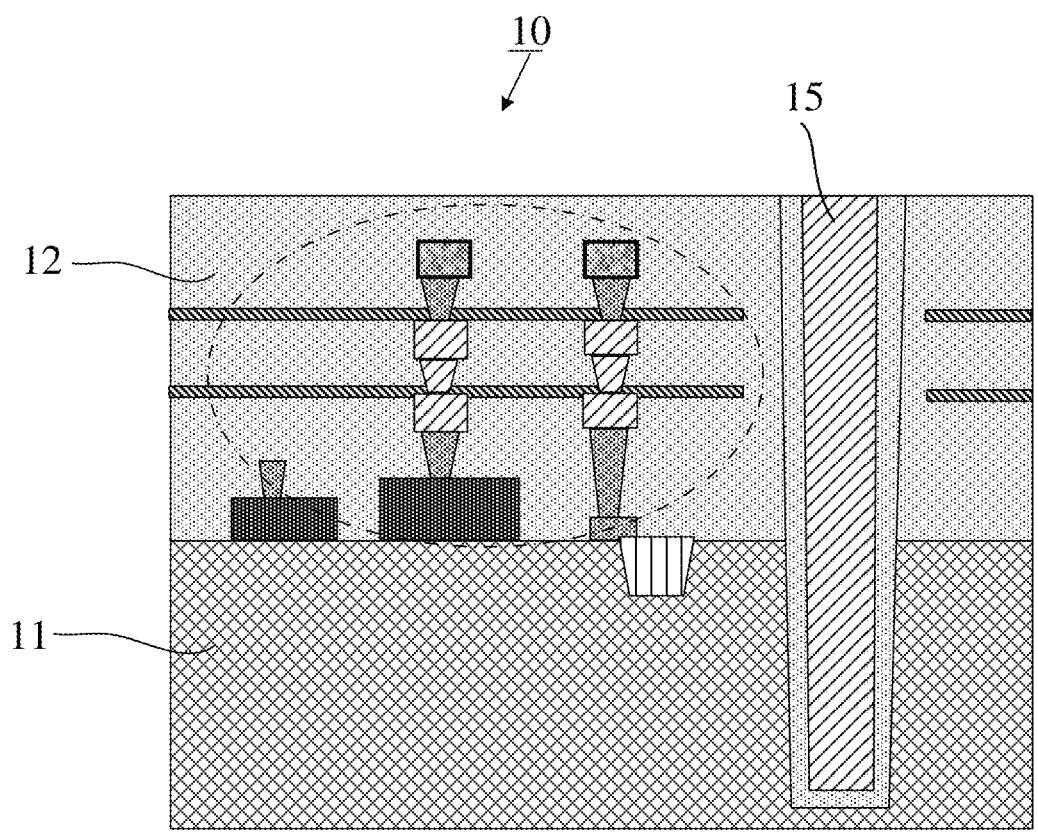
FIG. 2D illustrates a schematic diagram of forming processes of the semiconductor structure provided by the embodiments of the disclosure.

First, referring to FIG. 2A, the wafer 10 includes the semiconductor device 12. Then, referring to FIG. 2B, the blind hole 13 is formed in a preset position of a surface of the wafer through an etching process. Then, referring to FIG. 2C, a first metal material is deposited in the blind hole 13 by the CP process, for example, Cu is deposited to form a TSV 15. After the TSV is formed, excess first metal material is also attached to the surface of the wafer, so defects, such as pits for bumps, may be formed in the surface of the wafer. Therefore, in FIG. 2D, the first metal material deposited on the surface of the wafer 10 is removed by adopting the processes, such as etching, grinding, and polishing, and the surface of the wafer 10 is planarized.

In FIG. 2A to FIG. 2E, the semiconductor device 12 includes a memory device, metal interconnection layers M1, M2, and M3, a contact hole CT, vias V1 and V2, etc. The contact hole CT is a connection channel of a memory device, such as a transistor, and M1. The via V1 is a connection channel between the metal interconnection layer M1 and the metal interconnection layer M2 formed in an Inter Metal Dielectric 1 (IMD). The via V2 is a connection channel between the metal interconnection layer M2 and the metal interconnection layer M3 formed on an IMD2.

In some embodiments, a process for forming the TSV 15 may adopt Via Last, that is, the TSV 15 is formed after a device structure is formed, so as to avoid a problem of pollution of the TSV caused by the deposition of a metal in a process of forming the device structure.

In the embodiments of the disclosure, taking the memory device as an example, the semiconductor device includes a memory device, such as a transistor. Thus, the formation of S101 includes the following steps.

At S111, a substrate is provided.

Here, the substrate may be a silicon substrate. In other embodiments, the substrate may include other semiconductor elements such as germanium (Ge), or semiconductor compounds such as silicon carbide (SiC), gallium arsenide (GaAs), gallium phosphide (GaP), indium phosphide (InP), indium arsenide (InAs), or indium antimonide (InSb), or other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or a combination thereof.

At S112, the semiconductor device is formed on the substrate. The semiconductor device includes a memory device and metal interconnection layers.

In some embodiments, the memory device in the semiconductor device may be a transistor. The metal interconnection layers may form a connection line through a metal conductive material to connect different memory devices to form a circuit. When the metal interconnection layers in the embodiments of the disclosure are formed, the resistivity of an interconnection material, the step coverage and the surface planeness of a deposition process, the electromigration, the stress, etc. need to be considered. By using a material with low resistivity for interconnection, the loss and the RC delay of the chip can be reduced, and the speed of the chip can be improved. The RC delay refers to a signal delay caused by resistance (R) and capacitance (C) during charging and discharging. Materials serving as interconnection metals in the metal interconnection layers include W, Cu, Al, etc.

Further understanding is made to S111 and S112 below with reference to FIG. 2E.

Figure 2E:
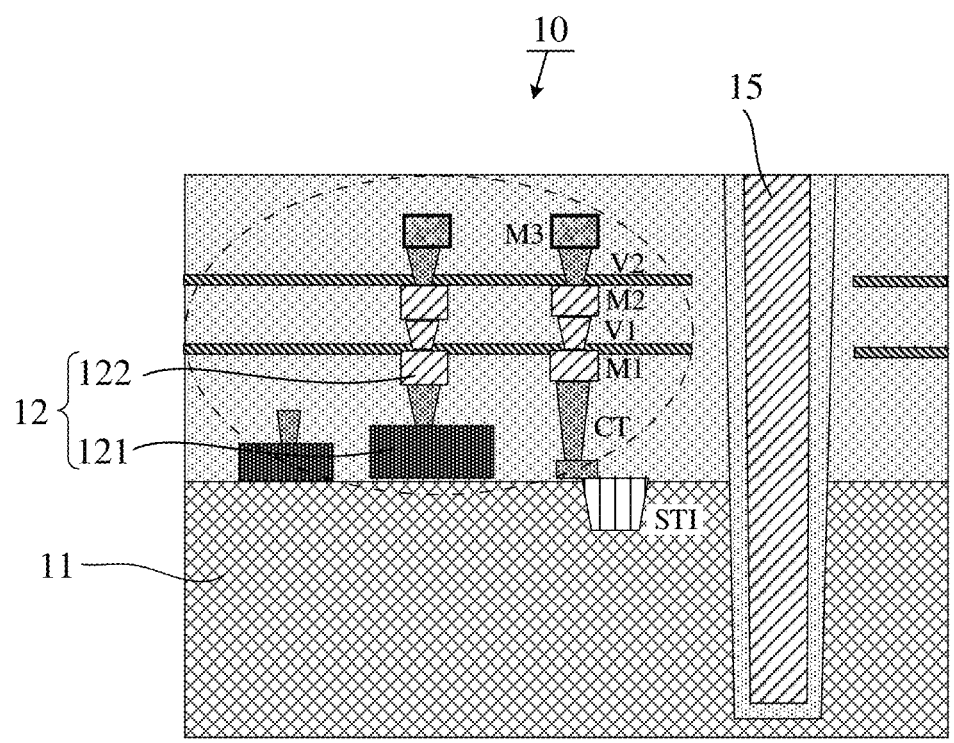
FIG. 2E illustrates a schematic structural diagram of a wafer provided by the embodiments of the disclosure.

In FIG. 2E, the wafer 10 includes a substrate 11 and a semiconductor device 12. The semiconductor device 12 is located on an upper surface of the substrate 11. The substrate 11 includes a Shallow Trench Isolation (STI) structure. The semiconductor device 12 in the embodiments of the disclosure includes a memory device 121 and metal interconnection layers 122. The metal interconnection layers 122 include metal interconnection layers M1, M2, and M3. The contact hole CT is used for realizing the electrical connection between the memory device 121 and the metal interconnection layers M1. The via V1 is used for realizing the electrical connection between the metal interconnection layers M1 and the metal interconnection layers M2. The via V2 is used for realizing the electrical connection between the metal interconnection layer M2 and the metal interconnection layer M3.

In a Via Middle process, in wafer on wafer bonding of a packaging process, the wafer on wafer hybrid bonding cannot be performed due to the unevenness of a passivation layer on the surface of the wafer. Some unevenness of the passivation layer on the surface of the wafer is the unevenness of the surface of the wafer caused by an electroplating process during the wafer on wafer bonding. After the electroplating process, an interlayer dielectric layer and the passivation layer formed in sequence also have a phenomenon of unevenness.

Figure 3:
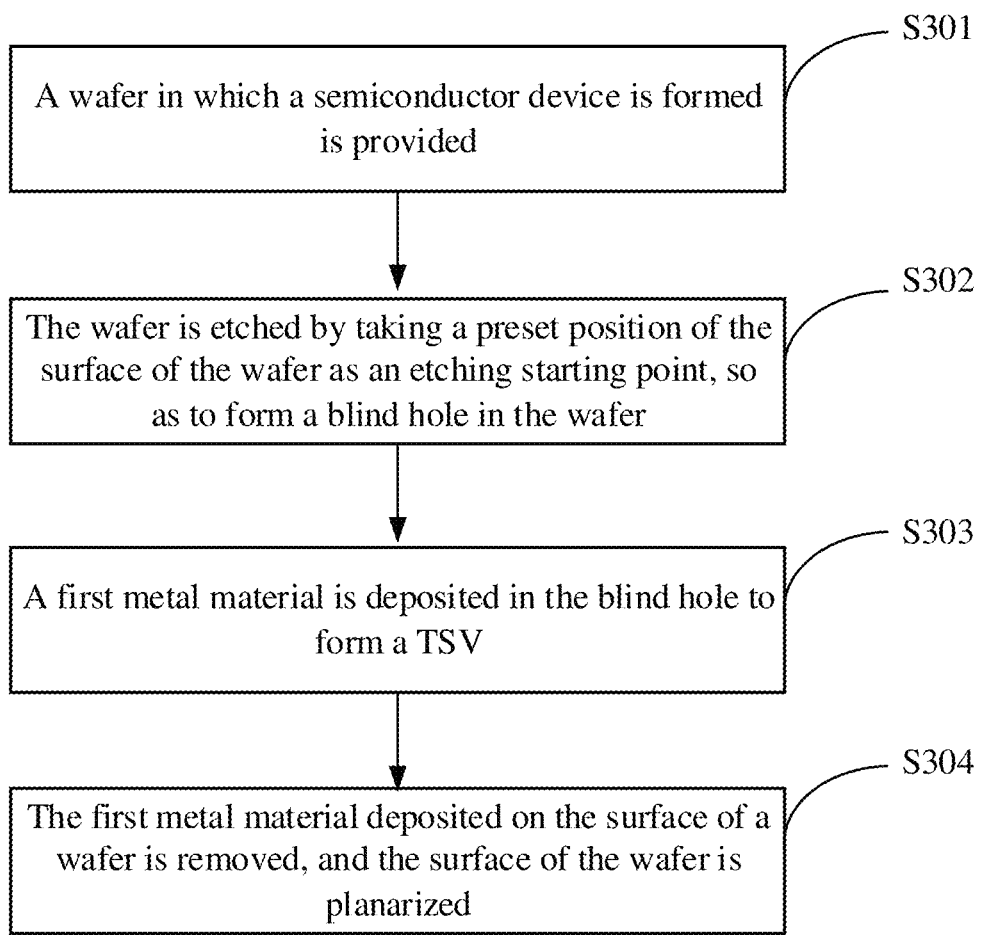
FIG. 3 illustrates an implementation flowchart of a method for forming another semiconductor structure provided by the embodiments of the disclosure.

The embodiments of the disclosure further provide a method for forming a semiconductor structure. The TSV is formed in a Via Middle process. Referring to FIG. 3, the method includes the following operations.

At S301, a wafer in which a semiconductor device is formed is provided.

Here, in the embodiments of the disclosure, after the interlayer dielectric layer is formed, the passivation layer may not be formed, so that the surface of the wafer may be the interlayer dielectric layer.

At S302, the wafer is etched by taking a preset position of the surface of the wafer as an etching starting point, so as to form a blind hole in the wafer.

In some embodiments, a forming process of the blind hole may adopt a Deep Reactive Ion Etching (DRIE) technology or a Laser Drilling technology. The DRIE technology combines the two processes of depositing a polymer passivation layer and etching monocrystalline silicon to perform alternately, which can avoid the mutual influence between the depositing and the etching and ensure the stability and reliability of the passivation layer, thereby forming a high depth-to-width ratio structure with a steep side wall.

At S303, a first metal material is deposited in the blind hole to form a TSV.

In the embodiments of the disclosure, the TSV may be prepared after the FEOL and the Middle of Line (MOL), and before the BEOL.

In some embodiments, the implementation of S303 includes the following operations.

At S331, an insulating layer covering an inner wall of the blind hole is deposited on the inner wall of the blind hole.

Here, the insulating layer is arranged to prevent conducting electricity between the first metal material filled (forming a conductive layer) and the substrate in a subsequent process and protect the substrate from being damaged. The materials of the insulating layer in the present embodiment include a silicon oxide (such as $SiO_2$), a silicon nitride ($Si_3N_4$), etc. The deposition of the insulating layer often adopts a PECVD method, a thermal oxidation technology, or a vacuum vapor deposition technology. The PECVD method has high deposition rate, low process temperature, and strong film covering capacity, and is widely applied to depositing insulating layer materials, such as $SiO_2$, $Si_3N_4$. The thermal oxidation technology is used for depositing silicon dioxide. The vacuum vapor deposition technology is used for depositing a p-xylene material.

In some embodiments, after the insulating layer covering the inner wall of the blind hole is deposited, a barrier layer and a seed layer are deposited in sequence. That is to say, a deposition sequence on the inner wall of the blind hole is that: first, the insulating layer is deposited on the inner wall of the blind hole; then, the barrier layer is deposited on the insulating layer; and finally, the seed layer is deposited on the barrier layer.

The barrier layer is used for preventing the first metal material filled in the subsequent process from diffusing and improving the adhesion strength of the seed layer. Common materials of the barrier layer may include titanium, titanium nitride, tantalum, tantalum nitride, tungsten, tungsten nitride, vanadium, vanadium nitride, niobium, or niobium nitride. The deposition of the barrier layer may adopt a PVD method, a CVD method, a Plasma Enhanced Magnetron Sputtering (PEMS) technology, or the like.

The seed layer is used for providing connection for subsequent formation of the conductive layer in the TSV. The material of the seed material may be any conductive material, for example, W, Co, Cu, Al, or any combination thereof. The seed layer may be prepared by one or more deposition methods the same as those for preparing the barrier layer.

At S332, the first metal material is deposited to form a conductive layer of the TSV after the insulating layer is formed.

In some embodiments, the conductive layer is used for conducting electricity. The conductive material in the conductive layer may be the same as or different from the conductive layer in the seed layer. The material of the conductive layer adopts Cu.

At S304, the first metal material deposited on the surface of a wafer is removed, and the surface of the wafer is planarized.

Here, the planarization adopts a Chemical Mechanical Polishing (CMP) technology. During implementing, first, the material on the surface of the wafer chemically reacts with an oxidant, a catalyst, and the like in a polishing solution to form a soft layer that is relatively easy to remove. Then, the soft layer is removed under the mechanical actions of an abrasive in the polishing solution and a polishing pad, so that the surface of a workpiece is exposed again. Finally, the chemical reaction and the mechanical actions are performed again, and the above operations are repeated in such a mode. Thus, the polishing of the surface of the workpiece is completed during alternating of a chemical action process and a mechanical action process.

Next, S301 to S304 will be further described in detail with reference to FIG. 4A to FIG. 4D.

Figure 4A:
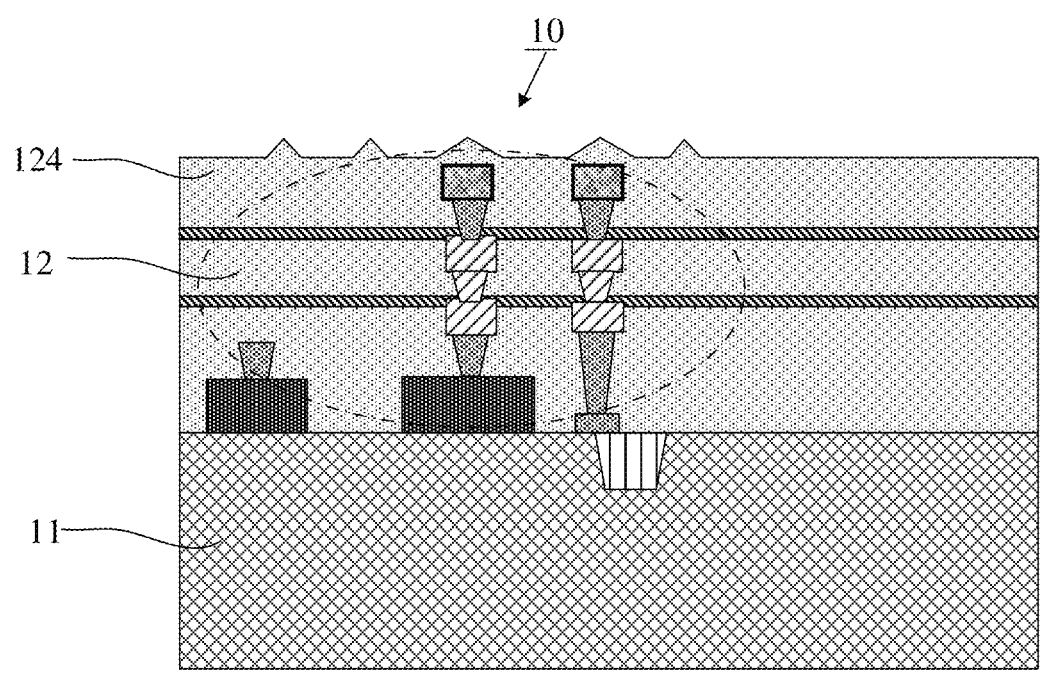
FIG. 4A illustrates a schematic diagram of forming processes of the semiconductor structure provided by the embodiments of the disclosure.
Figure 4B:
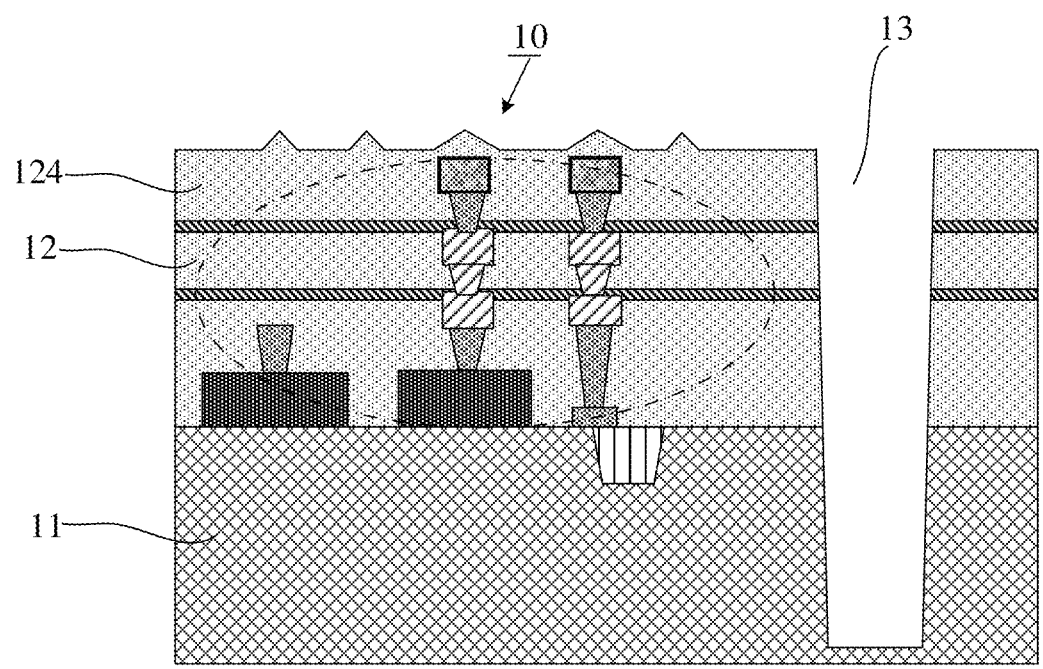
FIG. 4B illustrates a schematic diagram of forming processes of the semiconductor structure provided by the embodiments of the disclosure.

Referring to FIG. 4A, the wafer 10 includes a substrate 11, a semiconductor device 12, and an interlayer dielectric layer 124. The surface of the wafer 10 is the interlayer dielectric layer 124. In FIG. 4B, the interlayer dielectric layer 124 and the substrate 11 are etched at a preset position of the upper surface of the wafer 10 in sequence through the DRIE technology, and the blind hole 13 is formed in the wafer 10. Next, referring to the left panel of FIG. 4C, an isolation layer 15a and a conductive layer 15b are deposited in the blind hole 13 in sequence by one or more deposition processes, such as the CVD method or the PVD method, so as to form the TSV 15.

Figure 4C:
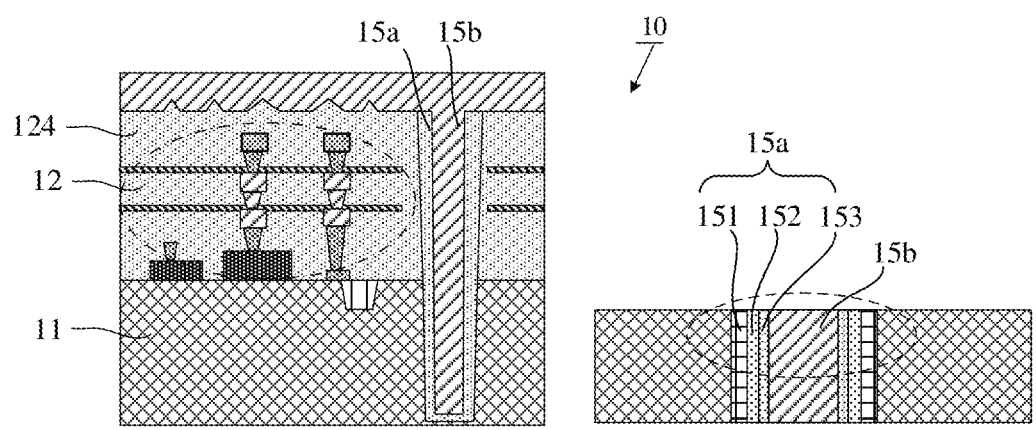
FIG. 4C illustrates a schematic diagram of forming processes of the semiconductor structure provided by the embodiments of the disclosure.

In addition, S331 and S332 may be understood with reference to FIG. 4C. In the right panel of FIG. 4C, the formation of the TSV includes: the insulating layer 151, the barrier layer 152, the seed layer 153, and the conductive layer 15b covering the inner wall of the blind hole 13 are deposited on the inner wall of the blind hole 13. The insulating layer 151, the barrier layer 152, and the seed layer 153 form the isolation layer 15a.

Figure 4D:
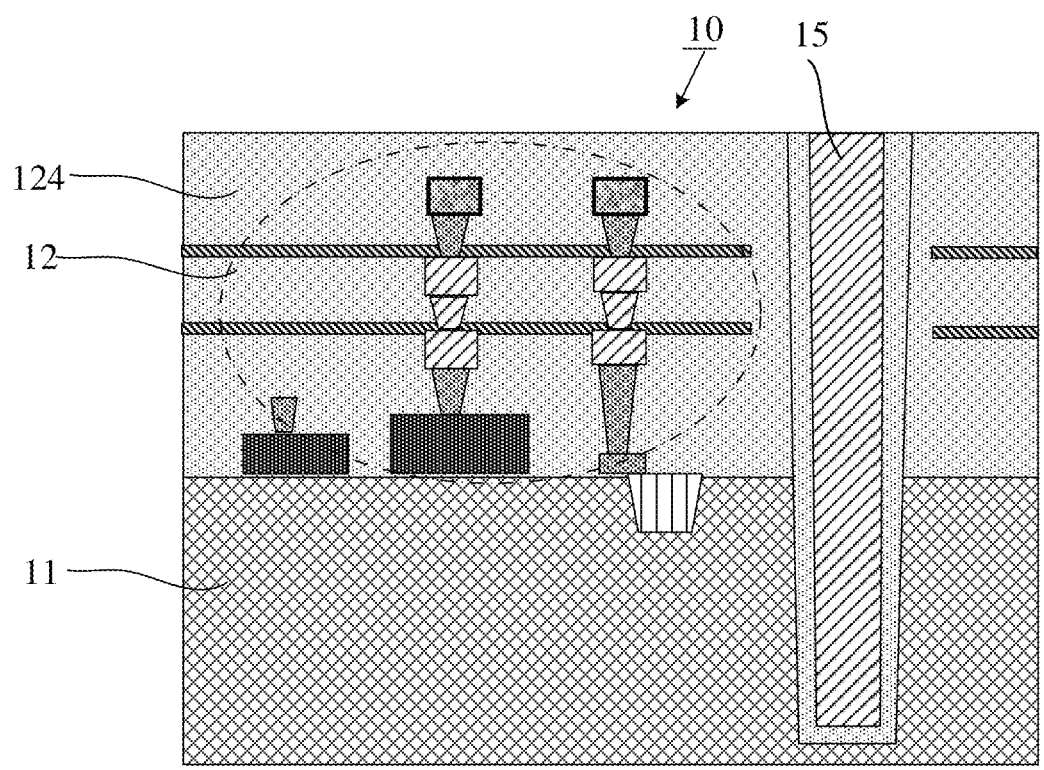
FIG. 4D illustrates a schematic diagram of forming processes of the semiconductor structure provided by the embodiments of the disclosure.

During the formation of the TSV, a variety of excess materials are deposited on the surface of the wafer, such as the materials in the insulating layer, the barrier layer, the seed layer, and the conductive layer, so the surface of the wafer needs to be further treated. In FIG. 4D, through the CMP process, on one hand, the excess material may be removed from the surface of the wafer 10; and on the other hand, the surface of the wafer 10 can also be planarized. After the processes of removing and planarizing are completed, the TSV 15 with a planar surface is obtained.

Figure 5:
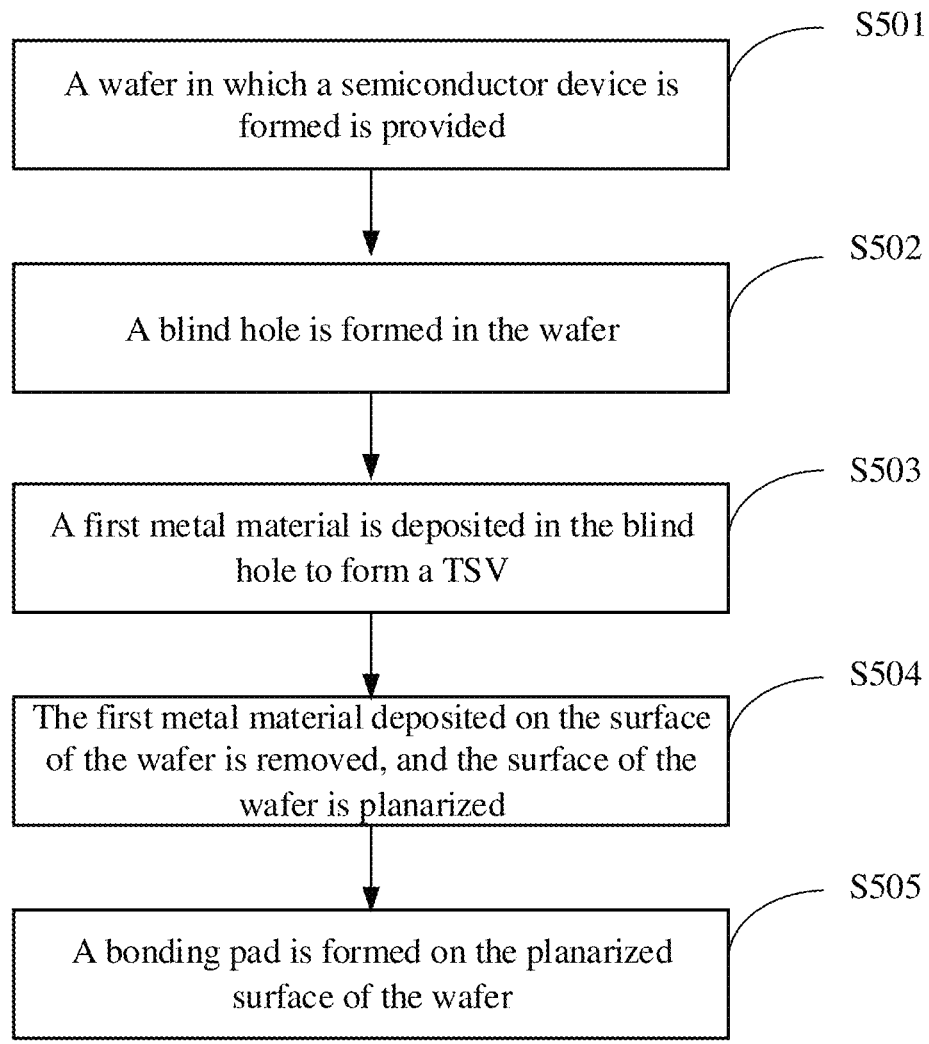
FIG. 5 illustrates an implementation flowchart of a method for forming a third semiconductor structure provided by the embodiments of the disclosure.

The embodiments of the disclosure further include a method for forming a third semiconductor structure. Referring to FIG. 5, the method includes the following operations.

At S501, a wafer in which a semiconductor device is formed is provided.

At S502, a blind hole is formed in the wafer.

At S503, a first metal material is deposited in the blind hole to form a TSV.

At S504, the first metal material deposited on the surface of the wafer is removed, and the surface of the wafer is planarized.

At S505, a bonding pad is formed on the planarized surface of the wafer.

In actual applications, the wafer on wafer bonding refers to a technology that two bright-polished homogeneous or heterogeneous wafers are closely combined through chemical and physical actions, after the wafers are bonded, atoms at a wafer interface react under the action of an external force to form covalent bonds and combine into a whole, and the bonding interface reaches a specific bonding strength.

In the embodiments of the disclosure, the surface of the wafer is planarized by using the CMP process after the TSV is formed, and then a bonding pad is formed on the planarized surface of the wafer. Thus, after the bonding pad is formed, the surface of the wafer is planar by only performing a planarizing treatment once, so that the process flow is simplified.

In some embodiments, the implementation of S505 includes the following operations.

At S551, a barrier layer is deposited on the planarized surface of the wafer.

Here, the barrier layer is an isolation layer formed between an upper material and a lower material, which prevents the upper material and the lower material from diffusing into each other, and improves the adhesion between the upper material and a barrier layer material and between the lower material and the barrier layer material. The metal of the barrier layer has the requirements of low contact resistance, good side wall and step coverage, and high barrier property. The materials used by the barrier layer in the present embodiment include silicon dioxide, silicon nitride, silicon oxynitride, etc. A deposition process of the barrier layer includes a CVD method or a PVD method.

At S552, a hard mask layer is deposited on the surface of the barrier layer.

A hard mask process technology refers to a technology that a pattern is transferred to the hard mask layer (also called an intermediate layer) by using very thin photoresist, and then the pattern is transferred to a bottom film material through the intermediate layer.

In some embodiments, the material of the hard mask layer may be silicon dioxide, silicon nitride, silicon carbide, tantalum oxide, or the like. The hard mask layer may be prepared by using a Plasma Enhanced Chemical Vapor Deposition (PECVD) method or the CVD method.

At S553, the hard mask layer is patterned, and the surface of the barrier layer is etched by using a mask pattern, so as to form a via exposing the metal interconnection layer and the blind hole.

Here, the patterning refers to a process of transferring a pattern from the photoresist layer to the hard mask layer. A common process of patterning is dry etching, including Plasma Etching (PE), Plasma Sputtering Etching (PSE), Reaction Ion Etch (RIE), or the like.

In some embodiments, the process of etching the mask pattern may be dry etching, which may adopt one or more etching processes that are the same as the patterning process.

In some embodiments, the preparation technology of the via may be the same as the technology for preparing the blind hole at S102, including etching an upper surface of the metal interconnection layer and an upper surface of the TSV by using dry etching or wet etching.

At S554, a second metal material is deposited in the via to form a bonding pad.

In some embodiments, the second metal material is the same as the first metal material. The "deposition" process may adopt one or more processes the same as those for depositing the first metal material.

Next, S551 to S553 will be further described in detail with reference to FIG. 6A to FIG. 6D.

Figure 6A:
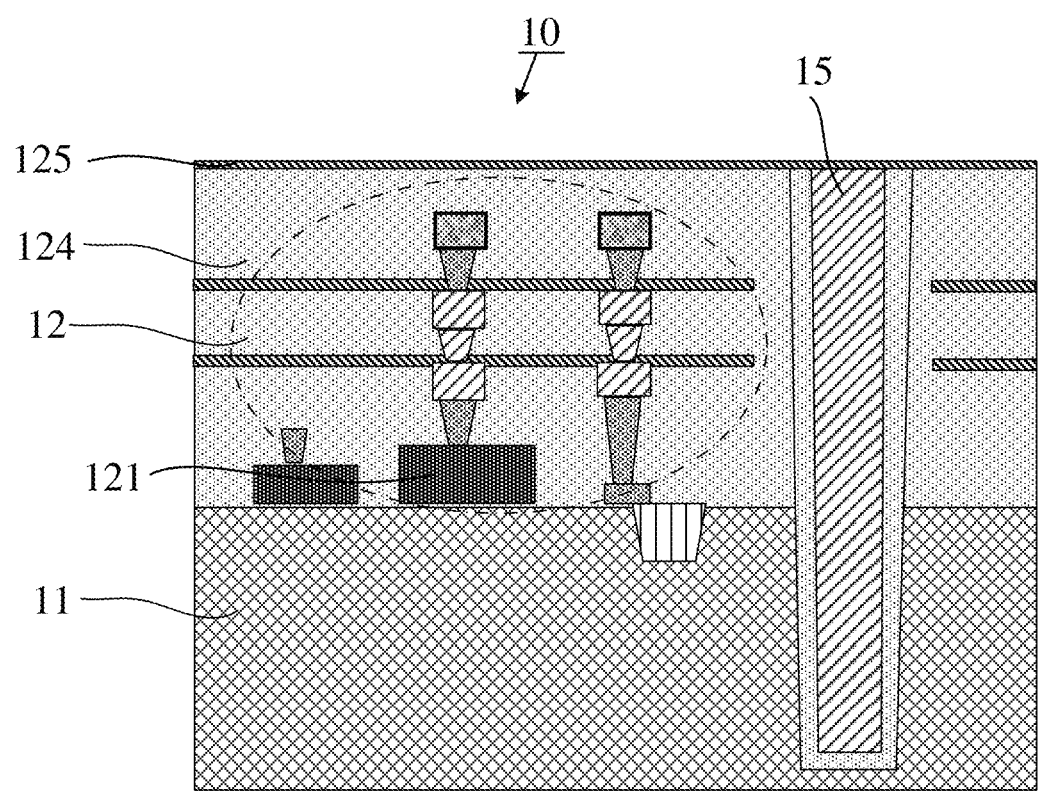
FIG. 6A illustrates a schematic diagram of forming processes of a bonding pad provided by the embodiments of the disclosure.
Figure 6B:
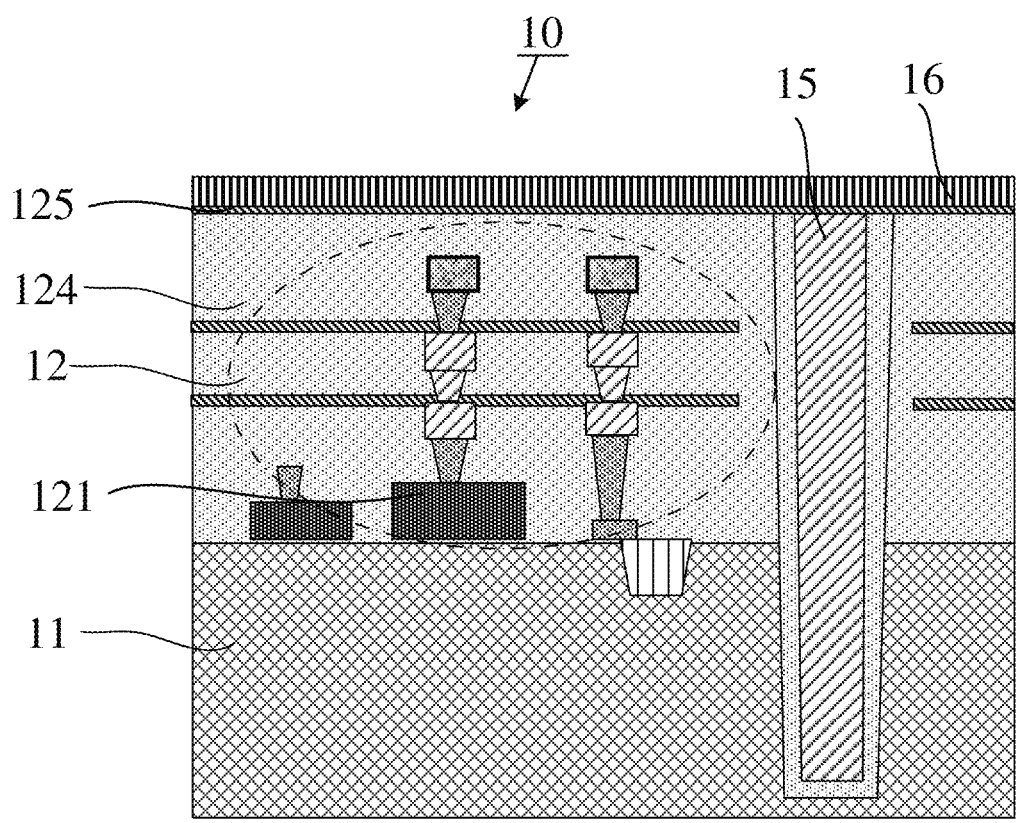
FIG. 6B illustrates a schematic diagram of forming processes of a bonding pad provided by the embodiments of the disclosure.

Referring to FIG. 6A, first, the barrier layer 125 is deposited on an upper surface of the interlayer dielectric layer 124 by the CVD method or the PVD method. Then, in FIG. 6B, a hard mask layer 16 is deposited on the upper surface of the barrier layer 125 by the PECVD method or the CVD method. After that, the hard mask layer 16 is patterned by dry etching, and the upper surface of the barrier layer 125 is further etched by using a mask pattern, so as to form vias 17a, 17b, and 17c respectively exposing the metal interconnection layer 122 and the TSV 15. Finally, the vias 17a, 17b, and 17c are respectively filled with a second metal material to form bonding pads 18a, 18b, and 18c in FIG. 6D.

In some embodiments, when the second metal materials filled are different, the filling processes used are different. For example, when W is used as the conductive material, the CVD method is adopted. When Al is used as the conductive material, the CVD method or the PVD method is adopted. When Cu is used as the conductive material, the CP method is adopted.

Figure 6C:
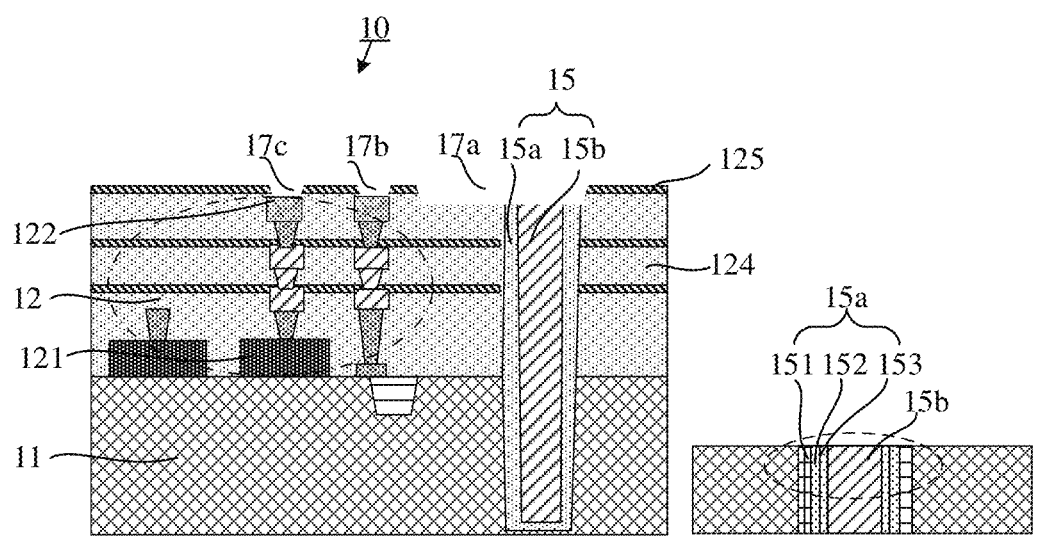
FIG. 6C illustrates a schematic diagram of forming processes of a bonding pad provided by the embodiments of the disclosure.
Figure 6D:
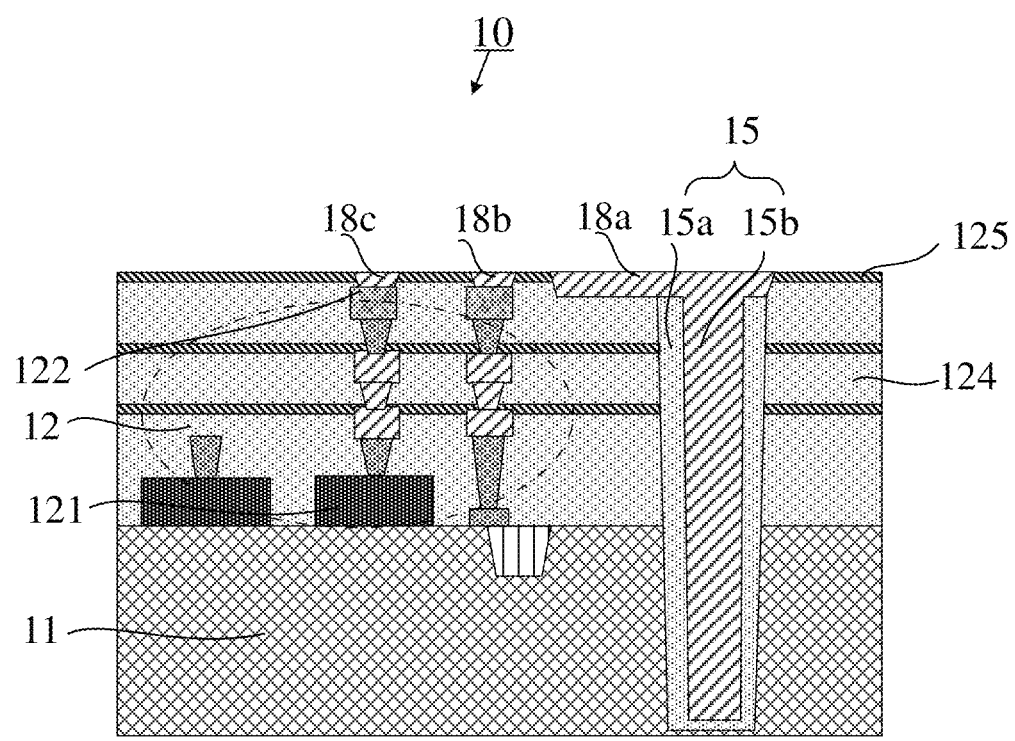
FIG. 6D illustrates a schematic diagram of forming processes of a bonding pad provided by the embodiments of the disclosure.

In addition, referring to FIG. 6C, the via 17a can expose the TSV 15, and the 17b and 17c can expose the metal interconnection layer 122. Referring to FIG. 6D, it can be known that the bonding pad 18a and the TSV 15 realize electrical connection, and the bonding pads 18b and 18c and the metal interconnection layer 122 realize electrical connection.

In the embodiments of the disclosure, firstly, the barrier layer is deposited on the planarized surface of the wafer. Secondly, the surface of the barrier layer is etched to form a via exposing the metal interconnection layer and the blind hole. Thirdly, a second metal material is deposited in the via. Finally, the CMP process needs to be performed on the surface of the wafer again to remove excess second metal material, so that a bonding pad with a planar surface can be formed.

In some embodiments, assuming that the surface where the bonding pad is located is a first surface. After S505, the method further includes the following steps.

At S506, starting from a second surface opposite to the first surface, the wafer on which the bonding pad is formed is thinned to a preset thickness.

Here, the preset thickness refers to the thickness of a wafer required for late packaging. According to different late packaging processes, the preset thickness is different. Wafer thinning is performed for 3D packaging, and the wafer thinning is performed to ensure that the ratio of the aperture to the thickness of the formed via is within a reasonable range, and the thickness of a final package can be made acceptable.

In some embodiments, a wafer thinning method may adopt mechanical grinding, dry etching, wet etching, or the like. In order to prevent the wafer from the problems of warping, sagging, surface damage expansion, wafer fracture, and the like after thinning, during implementing, on one hand, a layer of glass (or silicon) bearing material is pasted on the surface of the wafer before thinning as a bearing support for fixing and strengthening an ultra-thin wafer; and on the other hand, a sheet with an area and thickness equivalent to the area and thickness of the wafer is placed on the periphery of the wafer, so that the wafer in the center is stressed evenly during thinning Therefore, a wafer which does not have a defect or a crack and has uniform thickness at the edge can be obtained.

In the embodiments of the disclosure, the wafer needs to be thinned to a preset thickness after the TSV and the bonding pad are formed, and a heat dissipation effect of the chip can be improved through a thinning process of the wafer.

Based on FIG. 6D, the embodiments of the disclosure provide a semiconductor structure, which includes: a wafer 10, a TSV 15, and a bonding pad 18a.

A semiconductor device 12 is formed in the wafer 10.

The TSV 15 is formed in the wafer.

The bonding pad 18a is electrically connected to the TSV.

In some embodiments, continuing to refer to FIG. 6D, the wafer 10 includes a substrate 11 and a semiconductor device 12 formed on the substrate 11. The semiconductor device includes a memory device 121 and a metal interconnection layer 122.

Continuing to refer to FIG. 6D, the memory device 121 is located in the interlayer dielectric layer 124, and the TSV 15 is located in the substrate 11 and the interlayer dielectric layer 124.

In some embodiments, referring to FIG. 6C, the TSV 15 includes an isolation layer 15a and a conductive layer 15b. The isolation layer 15a includes an insulating layer 151, a barrier layer 152, and a seed layer 153.

In some embodiments, the bonding pad is formed by using a second metal material.

Figure 7:
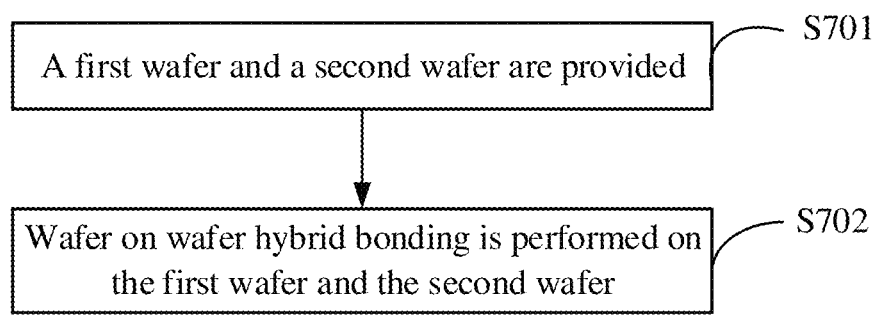
FIG. 7 illustrates an implementation flowchart of a wafer on wafer bonding method provided by the embodiments of the disclosure.

In the embodiments of the disclosure, a wafer on wafer bonding method is further provided. Referring to FIG. 7, the method includes the following operations.

At S701, a first wafer and a second wafer are provided. The first wafer and the second wafer may be manufactured by the method provided by the abovementioned embodiments.

Here, the first wafer and the second wafer may be the same wafers, or may be different wafers. The conductive materials in the bonding pads formed by the first wafer and the second wafer may be the same or different.

At S702, wafer on wafer hybrid bonding is performed on the first wafer and the second wafer, so as to form a hybrid bonding area.

Here, the hybrid bonding area is formed by corresponding bonding pads in the first wafer and the second wafer. Common welding processes include Reflow Soldering (RS), Thermal Compression Bond (TCB), etc.

The wafer on wafer bonding method is described in detail below with reference to FIG. 8.

Figure 8:
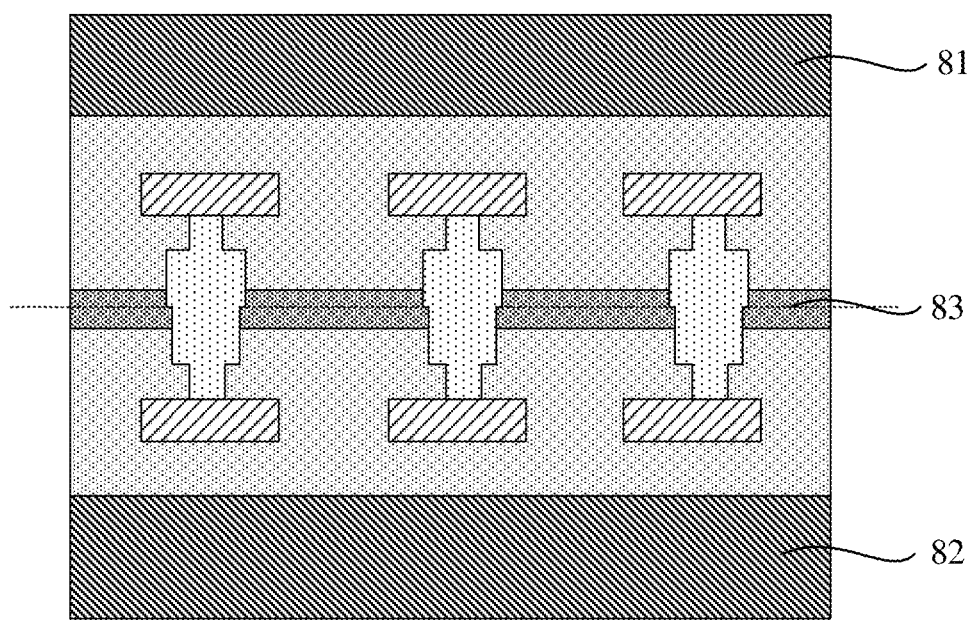
FIG. 8 illustrates a schematic structural diagram of a hybrid bonding area formed by wafer on wafer bonding provided by the embodiments of the disclosure.

There are two wafers in FIG. 8, including a first wafer 81 and a second wafer 82. The first wafer 81 and the second wafer 82 may be manufactured by the method provided by the abovementioned embodiments. The first wafer and the second wafer may be the same or different. Both the first wafer 81 and the second wafer 82 include bonding pad structures. The structure of the bonding pad may refer to FIG. 6D. The conductive materials in the bonding pads formed in the first wafer 81 and the second wafer 82 may be the same or different. Corresponding bonding pads in a first surface of the first wafer 81 and in a first surface of the second wafer 82 may be welded together to form a hybrid bonding area 83 through an RS welding process or a TCB welding process.

In the embodiments of the disclosure, after the TSV is formed, the surface of the wafer is planarized by using the CMP process, so as to form a planar surface of the wafer. Then the bonding pad with a planar surface is prepared, so that the wafer on wafer bonding can be realized at one time, and the process flow is simplified.

The semiconductor structure in the embodiments of the disclosure is similar to the method for forming the semiconductor structure in the abovementioned embodiments. The technical features not disclosed in detail in the embodiments of the disclosure refer to the abovementioned embodiments for understanding. The characteristics disclosed in several method or device embodiments provided in the disclosure may be freely combined without conflicts to obtain new method embodiments or device embodiments.

The abovementioned descriptions are only specific implementation modes of the disclosure, but the scope of protection of the disclosure is not limited thereto. Any variation or replacement readily figured out by a person skilled in the art within the technical scope disclosed in the disclosure shall fall within the scope of the protection of the disclosure. Therefore, the scope of the protection of the disclosure shall be subject to the scope of protection of the claims.

What is claimed is:

1. A method for forming a semiconductor structure, comprising:
    providing a wafer in which a semiconductor device is formed;
    forming a blind hole in the wafer;
    depositing a first metal material in the blind hole to form a through silicon via;
    removing the first metal material deposited on a surface of the wafer, and planarizing the surface of the wafer; and
    forming a bonding pad on a planarized surface of the wafer;
        wherein the forming a bonding pad on a planarized surface of the wafer comprises:
        depositing a hard mask layer on the planarized surface of the wafer;
        patterning the hard mask layer to form a via exposing the metal interconnection layer and the blind hole; and
        depositing a second metal material in the via to form the bonding pad.

2. The method of claim 1, wherein the providing a wafer in which a semiconductor device is formed comprises:
    providing a substrate; and
    forming the semiconductor device on the substrate, wherein the semiconductor device comprises a memory device and a metal interconnection layer.

3. The method of claim 1, wherein a material of the hard mask layer material comprises silicon nitride.

4. The method of claim 1, wherein the first metal material is same as the second metal material.

5. The method of claim 1, wherein the blind hole is formed in the wafer by using at least one of a dry etching process or a wet etching process.

6. The method of claim 1, wherein the depositing a first metal material in the blind hole to form a through silicon via comprises:
    depositing an insulating layer covering an inner wall of the blind hole on the inner wall of the blind hole; and
    depositing the first metal material to form a conductive layer of the through silicon via after the insulating layer is formed.

7. The method of claim 1, wherein the planarizing the surface of the wafer comprises:

planarizing the surface of the wafer through a chemical mechanical grinding process.

8. The method of claim 1, wherein a surface where the bonding pad is located is a first surface; and the method further comprises:

starting from a second surface opposite to the first surface, thinning the wafer on which the bonding pad is formed to a preset thickness.

9. A wafer on wafer bonding method, comprising:

providing a first wafer and a second wafer, wherein the first wafer and the second wafer are manufactured by the method of claim 1; and performing wafer on wafer hybrid bonding on the first wafer and the second wafer.

10. A semiconductor structure, comprising:

a wafer in which a semiconductor device is formed;

a through silicon via formed in the wafer; and a bonding pad electrically connected to the through silicon via;

wherein the semiconductor structure is formed with the method of claim 1.

11. The semiconductor structure of claim 10, wherein the wafer comprises:

a substrate; and the semiconductor device formed on the substrate, wherein the semiconductor device comprises a memory device and a metal interconnection layer.

12. The semiconductor structure of claim 10, wherein the through silicon via comprises an insulating layer and a conductive layer formed by using a first metal material; and wherein the bonding pad is formed by using a second metal material.

* * * * *